(12) United States Patent
Kizuna

(10) Patent No.: US 10,021,322 B2
(45) Date of Patent: Jul. 10, 2018

(54) SEMICONDUCTOR DEVICE

(71) Applicant: Renesas Electronics Corporation, Tokyo (JP)

(72) Inventor: Shunsuke Kizuna, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/216,945

(22) Filed: Jul. 22, 2016

(65) Prior Publication Data

US 2017/0085823 A1   Mar. 23, 2017

(30) Foreign Application Priority Data

Sep. 18, 2015   (JP) ................................. 2015-184675

(51) Int. Cl.

| | |
|---|---|
| *H03M 1/10* | (2006.01) |
| *H04N 5/357* | (2011.01) |
| *H03M 1/08* | (2006.01) |
| *H04N 5/378* | (2011.01) |
| *H04N 17/00* | (2006.01) |
| *H03M 1/12* | (2006.01) |

(52) U.S. Cl.
CPC ............ *H04N 5/3577* (2013.01); *H03M 1/08* (2013.01); *H04N 5/378* (2013.01); *H04N 17/002* (2013.01); *H03M 1/12* (2013.01)

(58) Field of Classification Search
CPC .......... H03M 1/123; H03M 1/56; H03M 1/12; H03M 1/1071; H03M 1/188; H03M 1/108; G09G 3/006; G09G 2320/0285; G09G 2320/029; G09G 2320/0693; H04N 17/002; H04N 5/378; H04N 17/00; H04N 5/335; H04N 21/44008; H04N 5/4401
USPC .......................................... 341/118, 120, 155
See application file for complete search history.

(56) References Cited

U.S. PATENT DOCUMENTS

| | | | | |
|---|---|---|---|---|
| 5,406,329 A | * | 4/1995 | Kashimura ............. | H03M 1/12 348/175 |
| 5,936,617 A | * | 8/1999 | Uchino ................ | G09G 3/3611 345/204 |
| 6,366,312 B1 | * | 4/2002 | Crittenden ............. | H04N 5/361 348/175 |
| 6,388,245 B1 | | 5/2002 | Lee | |
| 7,298,304 B2 | * | 11/2007 | Kamath ............... | H04N 17/002 341/118 |
| 8,742,313 B2 | | 6/2014 | Takamiya et al. | |

(Continued)

FOREIGN PATENT DOCUMENTS

| | | |
|---|---|---|
| JP | 4656753 B2 | 3/2011 |
| JP | 2011-239344 A | 11/2011 |
| JP | 2012-109658 A | 6/2012 |

*Primary Examiner* — Linh Nguyen
(74) *Attorney, Agent, or Firm* — Sughrue Mion, PLLC

(57) ABSTRACT

In semiconductor devices according to related art, it is impossible to sufficiently evaluate column ADC interference. According to one embodiment, a semiconductor device includes a plurality of analog/digital conversion circuits that are arranged in a column direction of a pixel array and convert a pixel output signal output from the pixel array for each row into a digital value, and a conversion signal selection circuit that selects one of the pixel output signal and a test signal having a test voltage for each analog/digital conversion circuit according to a test pattern and outputs the selected signal.

11 Claims, 11 Drawing Sheets

(56) References Cited

U.S. PATENT DOCUMENTS

| | | | |
|---|---|---|---|
| 8,914,137 B2* | 12/2014 | Crockett | G06F 9/4881 |
| | | | 381/104 |
| 8,957,996 B2 | 2/2015 | Kajihara et al. | |
| 2006/0220992 A1* | 10/2006 | Tanaka | G09G 3/293 |
| | | | 345/60 |
| 2009/0284629 A1* | 11/2009 | Nakao | H03M 1/108 |
| | | | 348/294 |
| 2012/0119063 A1* | 5/2012 | Takamiya | H04N 5/374 |
| | | | 250/208.1 |
| 2012/0169909 A1* | 7/2012 | Rysinski | H04N 5/374 |
| | | | 348/302 |
| 2014/0340496 A1* | 11/2014 | Okawa | A61B 1/00006 |
| | | | 348/65 |
| 2016/0028978 A1* | 1/2016 | Yu | H04N 5/361 |
| | | | 348/241 |

* cited by examiner

Fig. 5

EXAMPLES OF SIGNAL COMBINATION PATTERNS WHEN TEST IS PERFORMED

| | NUMBER OF PIXEL COLUMN | | | | | | | |
|---|---|---|---|---|---|---|---|---|
| ODD-NUMBER COLUMN | 1 | 3 | 5 | ... | M-2 | M | M+2 | ... |
| EVEN-NUMBER COLUMN | 2 | 4 | 6 | ... | N-2 | N | N+2 | ... |
| SIGNAL COMBINATION PATTERN 1 | 0 | 1 | 0 | ... | 1 | 0 | 1 | ... |
| SIGNAL COMBINATION PATTERN 2 | 1 | 0 | 1 | ... | 0 | 1 | 0 | ... |
| SIGNAL COMBINATION PATTERN 3 | 1 | 1 | 0 | ... | 0 | 1 | 1 | ... |
| ⋮ | ⋮ | ⋮ | ⋮ | ⋮ | ⋮ | ⋮ | ⋮ | ⋮ |
| SIGNAL COMBINATION PATTERN n | 1 | 1 | 1 | ... | 1 | 1 | 1 | ... |
| ⋮ | ⋮ | ⋮ | ⋮ | ⋮ | ⋮ | ⋮ | ⋮ | ⋮ |

M IS ODD NUMBER AND N IS EVEN NUMBER

EXAMPLES OF PATTERNS OF INPUT SIGNALS TO ADC WHEN TEST IS PERFORMED

| | | TEST VOLTAGE VT INPUT TO ADC CONNECTED TO SIGNAL PATH SWITCH CIRCUIT IN WHICH SELECTION VALUE IS SET TO 1 | |
|---|---|---|---|
| | | CONSTANT | SWEEP |
| PIXEL OUTPUT SIGNAL INPUT TO ADC CONNECTED TO SIGNAL PATH SWITCH CIRCUIT IN WHICH SELECTION VALUE IS SET TO 0 | CONSTANT | SIGNAL PATTERN 2 | SIGNAL PATTERN 1 |
| | SWEEP | SIGNAL PATTERN 3 | SIGNAL PATTERN 4 |

SEMICONDUCTOR DEVICE

CROSS-REFERENCE TO RELATED APPLICATIONS

This application is based upon and claims the benefit of priority from Japanese patent application No. 2015-184675, filed on Sep. 18, 2015, the disclosure of which is incorporated herein in its entirety by reference.

BACKGROUND

The present invention relates to a semiconductor device and relates to, for example, a semiconductor device that includes an imaging device that converts optical information into electrical information.

In an imaging device, the number of pixels has been increasing in order to improve the quality of an image. Therefore, in the imaging device, the number of rows and the number of columns in a pixel area in which light-receiving elements that convert optical signals into electrical signals are arranged have been increasing. In the imaging device, the light-receiving elements are activated for each row and the electrical signals are read out from the light-receiving elements for each column. The electrical signals that have been read out for each column are converted into digital values by analog/digital conversion circuits provided so as to correspond to the columns. A system in which image information is acquired from the imaging device synthesizes information on the pixels thus obtained to generate one image.

As described above, in the imaging device including a large number of pixels, there are a large number of signals that are converted from analog values into digital values at one time. The imaging device includes an analog/digital conversion circuit (hereinafter this circuit will be referred to as a column ADC) that performs analog/digital conversion that converts the analog value into the digital value for each row. In a recent imaging device, as the number of pieces of data that are converted at one time increases, an interference between column ADCs becomes a problem. A method of evaluating the interference between the column ADCs is disclosed in Japanese Unexamined Patent Application Publication No. 2011-239344.

The imaging device disclosed in Japanese Unexamined Patent Application Publication No. 2011-239344 includes: a pixel unit in which a plurality of pixels that perform photoelectric conversion are arranged in the form of a matrix; a pixel signal reading unit performing reading of a pixel signal in a signal line from the pixel unit in the unit of plural pixels, and performing column signal processing with respect to an input signal; and an evaluation pattern generation unit receiving a control signal and a signal line interception signal and generating a pseudo-evaluation pattern according to the control signal. Further, the evaluation pattern generation unit disclosed in Japanese Unexamined Patent Application Publication No. 2011-239344 separates a signal line of a column that is designated by the control signal from the pixel unit, connects the separated signal line to a fixed electric potential having a level according to the evaluation pattern, and supplies the corresponding signal to the pixel signal reading unit as a signal subject to the column signal processing.

Further, an example in which an analog voltage to be input to the column ADC is generated based on a test signal or the like such as in the evaluation pattern generation unit disclosed in Japanese Unexamined Patent Application Publication No. 2011-239344 is disclosed in Japanese Unexamined Patent Application Publication No. 2012-109658 and Japanese Patent No. 4656753.

SUMMARY

The interference between the column ADCs may occur in various situations. This is because the column ADCs are supplied with power from a common power supply line and the influence of power supply noise that is caused varies depending on a combination of the analog values to be converted. However, in the technique disclosed in Japanese Unexamined Patent Application Publication No. 2011-239344, a test voltage that is input in place of the pixel output signal can select only a ground voltage (e.g., dark level voltage) and the interference between the column ADCs cannot be sufficiently evaluated.

The other problems of the related art and the novel characteristics of the present invention will be made apparent from the descriptions of the specification and the accompanying drawings.

According to one embodiment, a semiconductor device includes a plurality of analog/digital conversion circuits that are arranged in a column direction of a pixel array and convert a pixel output signal output from the pixel array for each row into a digital value, and a conversion signal selection circuit that selects one of the pixel output signal and a test signal having a test voltage for each analog/digital conversion circuit according to a test pattern and outputs the selected signal.

According to the embodiment, the semiconductor device is able to evaluate the interference between various column ADC circuits.

BRIEF DESCRIPTION OF THE DRAWINGS

The above and other aspects, advantages and features will be more apparent from the following description of certain embodiments taken in conjunction with the accompanying drawings, in which:

FIG. 5 is a table for describing test patterns in the semiconductor device according to the first embodiment;

DETAILED DESCRIPTION

First Embodiment

For the sake of clarification of the description, the following description and the drawings are omitted or simplified as appropriate. Further, throughout the drawings, the same components are denoted by the same reference symbols and overlapping descriptions will be omitted as appropriate.

Figure 1:
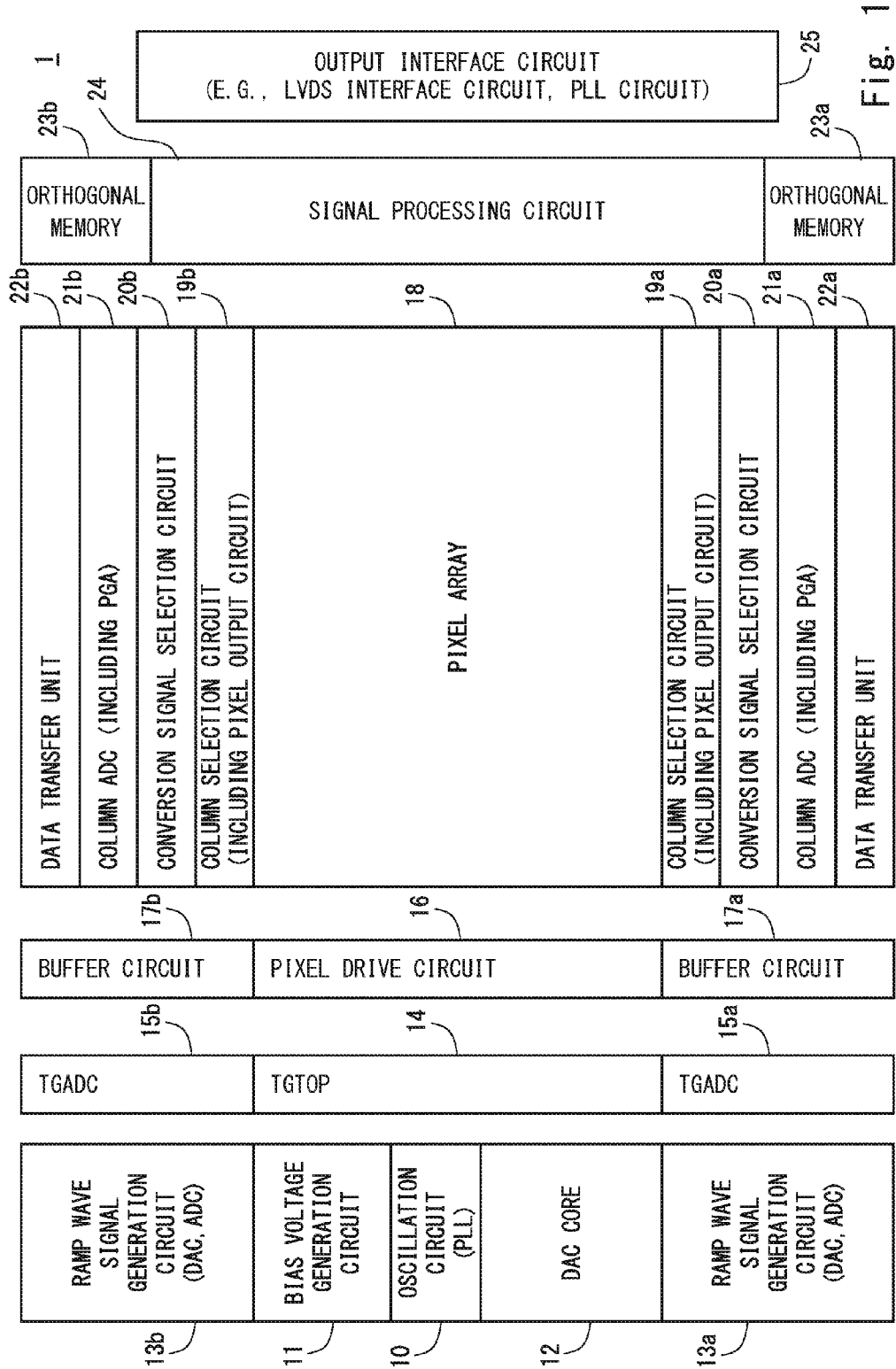
FIG. 1 is a block diagram of a semiconductor device according to a first embodiment.

FIG. 1 shows a block diagram of a semiconductor device 1 according to a first embodiment. The semiconductor device 1 is, for example, an imaging device. The semiconductor device 1 obtains a pixel output signal for each row from pixels arranged in the form of a matrix and converts the pixel output signal, which is an analog value, into a digital value by an analog/digital conversion circuit arranged in a column direction. That is, the semiconductor device 1 includes a semiconductor device that includes a function of performing conversion from the analog value into the digital value or conversion from the digital value into the analog value at one time by a plurality of parallel conversion processes. The imaging device shown in FIG. 1 is one example of the semiconductor device and the semiconductor device according to the first embodiment is not limited to the imaging device.

The semiconductor device 1 shown in FIG. 1 includes an oscillation circuit 10, a bias voltage generation circuit 11, a Digital-to-Analog Converter (DAC) core 12, ramp wave signal generation circuits 13a and 13b, a read timing generator 14, conversion timing generators 15a and 15b, a pixel drive circuit 16, buffer circuits 17a and 17b, a pixel array 18, column selection circuits 19a and 19b, conversion signal selection circuits 20a and 20b, column Analog-to-Digital Converters (ADCs) 21a and 21b, data transfer units 22a and 22b, orthogonal memories 23a and 23b, a signal processing circuit 24, and an output interface circuit 25.

The oscillation circuit 10 is, for example, a Phase Locked Loop (PLL) circuit and generates a clock signal used in the semiconductor device 1. The clock signal generated by the oscillation circuit 10 is distributed into the semiconductor device 1.

The bias voltage generation circuit 11 generates a bias voltage that is used in a circuit such as the ramp wave signal generation circuits, the pixel drive circuit, the buffer circuits, or the column ADCs. The number of bias voltages may be one or a plurality of voltage signals having a plurality of different voltage values.

The DAC core 12 generates a control signal including an analog voltage in accordance with a configuration value supplied from outside, a configuration value stored in the DAC core or the like. Another circuit block in the semiconductor device 1 operates based on this control signal.

The ramp wave signal generation circuits 13a and 13b generate ramp wave signals used in the analog/digital conversion processing by the column ADCs 21a and 21b. The conversion timing generators 15a and 15b instruct the ramp wave signal generation circuits 13a and 13b to generate the ramp wave signals in accordance with the period of the conversion processing performed by the column ADCs 21a and 21b. The buffer circuits 17a and 17b amplify the ramp wave signals and supply the amplified signals to the column ADCs 21a and 21b.

The read timing generator 14 controls the timing when the pixel drive circuit 16 drives the pixels arranged in the pixel array 18. The drive timing when the read timing generator 14 gives an instruction to the pixel drive circuit 16 is determined, for example, by the configuration value stored in a register provided in the read timing generator 14 or the configuration value supplied from the outside.

The pixel array 18 includes pixels that are arranged in the form of a matrix and outputs pixel information based on incident light information. The pixel information output from the pixel array 18 is an analog voltage that has been generated based on the charge generated by the pixel in accordance with the amount of the incident light. In the pixel array 18, the pixel is activated for each row and the pixel that has been activated outputs charge information for each column.

The column selection circuits 19a and 19b select the column that includes the pixels from which data is to be read out among the pixels arranged in the pixel array 18 and output the pixel information output from the column that has been selected as the pixel output signal. The column selection circuits 19a and 19b include a pixel output circuit (e.g., buffer circuit) to accurately transfer the pixel output signal to the subsequent circuit. A plurality of pixel output circuits are provided so as to correspond to the number of columns from which data is to be read out.

As described above, the pixel information is output by time division for each row. Further, the column selection circuit 19a outputs, for example, the pixel output signals from the pixels arranged in odd-numbered columns of the pixel array 18. The column selection circuit 19b outputs, for example, the pixel output signals from the pixels arranged in even-numbered columns of the pixel array 18. That is, in the semiconductor device 1, the pixel output signals output from the odd-numbered columns of the pixel array 18 are processed by a circuit group arranged above the pixel array 18 and the pixel output signals output from the even-numbered columns of the pixel array 18 are processed by a circuit group arranged below the column selection circuit 19. In FIG. 1, "a" is given to the last part of the symbols attached to the blocks used for the processing of the pixel output signals output from the odd-numbered columns and "b" is given to the last part of the symbols attached to the blocks used for the processing of the pixel output signals output from the even-numbered columns.

The conversion signal selection circuit 20a is provided between the column selection circuit 19a and the column ADC 21a. More specifically, the conversion signal selection circuit 20a is provided between the pixel output circuit of the column selection circuit 19a and the column ADC 21a. The conversion signal selection circuit 20b is provided between the column selection circuit 19b and the column ADC 21b. More specifically, the conversion signal selection circuit 20b is provided between the pixel output circuit of the column selection circuit 19b and the column ADC 21b.

The conversion signal selection circuits 20a and 20b select one of the pixel output signal and a test signal according to a test pattern for each of the analog/digital conversion circuits (e.g., the analog/digital conversion circuit provided so as to correspond to the column of the pixel array 19 included in the column ADCs 21a and 21b) and output the selected signal. The test pattern and the test signal may be input from outside or may be generated in the semiconductor device 1. In the following description, an example in which the test pattern and the test signal are generated in the semiconductor device 1 will be described. The details of the test pattern and the test signal will be described later.

The column ADCs 21a and 21b include a plurality of analog/digital conversion circuits, the plurality of analog/digital conversion circuits being provided so as to correspond to the plurality of pixel output circuits, converting the pixel output signal output from the pixel output circuit into the digital value, and being arranged in a column direction of the pixel array. Further, the column ADCs 21a and 21b include a variable gain amplifier (Programmable Gain Amplifier) that is provided so as to correspond to the plurality of analog/digital conversion circuits and amplifies the voltage level of the pixel output signal by a variable amplification ratio.

The data transfer units 22a and 22b transfer pixel output values including the digital values generated by the column ADCs 21a and 21b to the orthogonal memories 23a and 23b. The orthogonal memories 23a and 23b perform matrix transformation on the pixel output values received from the data transfer units 22a and 22b and output the resulting values to the signal processing circuit 24. The signal processing circuit 24 synthesizes the output pixel values received via the orthogonal memories 23a and 23b to generate one piece of image information. The output interface 25 outputs the image information generated by the signal processing circuit 24 to a subsequent system. The output interface 25 includes a circuit such as a Low Voltage Differential Signal (LVDS) interface circuit or a PLL circuit.

One of the characteristics of the semiconductor device 1 according to the first embodiment is the presence of the conversion signal selection circuits 20a and 20b. In the following description, configurations of the conversion signal selection circuits 20a and 20b and the circuits provided before and after the conversion signal selection circuits 20a and 20b will be described in detail. Since the conversion signal selection circuits 20a and 20b have substantially the same circuit configuration, in the following description, description will be given without discrimination between "a" and "b" attached to the last part of the symbols shown in FIG. 1. That is, in the following description, the column selection circuits 19a and 19b are simply referred to as a column selection circuit 19, the conversion signal selection circuits 20a and 20b are simply referred to as a conversion signal selection circuit 20, the column ADCs 21a and 21b are simply referred to as a column ADC 21, and the data transfer units 22a and 22b are simply referred to as a data transfer unit 22.

Figure 2:
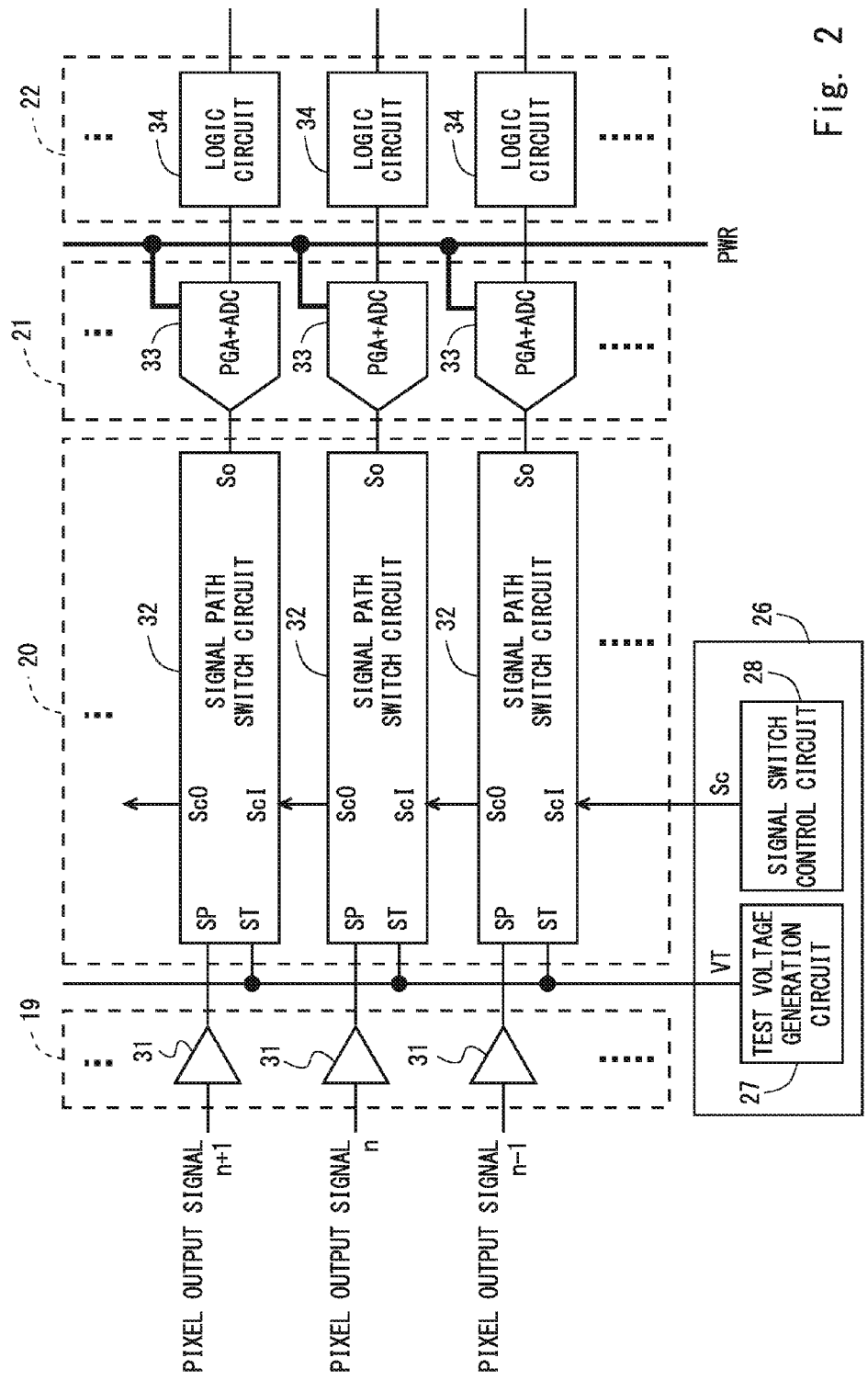
FIG. 2 is a block diagram of a conversion signal selection circuit and a column ADC according to the first embodiment.

FIG. 2 shows a block diagram of the conversion signal selection circuit and the column ADC according to the first embodiment. As shown in FIG. 2, the semiconductor device 1 according to the first embodiment includes, besides the column selection circuit 19, the conversion signal selection circuit 20, the column ADC 21, and the data transfer unit 22, a test control circuit 26 that generates a control signal Sc and a test signal VT to be supplied to the conversion signal selection circuit 20. The test control circuit 26 includes a test voltage generation circuit 27 and a signal switch control circuit 28. The test voltage generation circuit 27 generates the test signal VT. The test voltage generation circuit 27 is able to switch the voltage of the test signal VT between a constant voltage and a sweep voltage in which the voltage value is changed for every predetermined period of time. When the test voltage is the sweep voltage, the voltage value of the test voltage is monotonically increased or monotonically decreased at predetermined time intervals. The DAC core 12 may be used, for example, as the test voltage generation circuit 27. The signal switch control circuit 28 generates the control signal Sc. This control signal Sc includes a selection value to be supplied to each of the plurality of conversion signal selection circuits 20. A logic circuit in the signal processing circuit 24 may be used, for example, as the signal switch control circuit 28.

The test control circuit 26 is not necessarily provided in the semiconductor device 1 and may be provided outside the semiconductor device. Further, in FIG. 1, the test control circuit 26 is not shown.

The column selection circuit 19 includes a plurality of pixel output circuits 31 corresponding to the columns from which data is to be read out. FIG. 2 shows the pixel output circuits from the pixel output circuit corresponding to the (n−1)-th column to the pixel output circuit corresponding to the (n+1)-th column. The pixel output signal read out from the corresponding column from which data is to be read out is input to the pixel output circuit. In the column selection circuit 19, the pixel output circuit 31 is arranged in the column direction of the pixel array 18.

The conversion signal selection circuit 20 includes a plurality of signal path switch circuits 32 corresponding to the columns from which data is to be read out. FIG. 2 shows the signal path switch circuits from the signal path switch circuit corresponding to the (n−1)-th column to the signal path switch circuit corresponding to the (n+1)-th column. The signal path switch circuits 32 each include input terminals SP and ST, a control signal input terminal ScI, a control signal output terminal ScO, and an output terminal So. The pixel output signal is input to the input terminal SP. The test signal VT is input to the input terminal ST. The control signal Sc is input to the control signal input terminal ScI. The control signal Sc is output from the control signal output terminal ScO. One of the pixel output signal and the test signal VT that has been selected by the signal path switch circuit 32 is output from the output terminal So. The signal path switch circuits 32 are arranged in the column direction of the pixel array 18.

The signal path switch circuit 32 selects one of the pixel output signal and the test signal VT according to the selection value supplied by the control signal Sc and outputs the selected signal. Further, the selection value is supplied to the signal path switch circuit 32 by the control signal. In the first embodiment, the signal path switch circuit 32 holds the selection signal that has been supplied and outputs the selection value held in the signal path switch circuit 32 arranged next thereto. The signal path switch circuit 32 then successively gives the selection value to the signal path switch circuit 32 arranged next to it according to the clock signal (not shown). The way in which the control value is supplied to the signal path switch circuit 32 can be changed as appropriate according to the specification and the way in which the control value is supplied described in this specification is one example of the way in which the control value is supplied.

The column ADC 21 includes a plurality of ADC units 33 corresponding to the columns from which data is to be read out. The ADC units 33 each include a variable gain amplifier and an analog/digital conversion circuit. The ADC units 33 each outputs a digital value corresponding to the analog value (e.g., analog voltage value) of the signal output from the signal path switch circuit 32. The ADC units 33 are arranged in the column direction of the pixel array 18.

Further, in the column ADC 21, power is supplied to the ADC units 33 via a power supply line PWR that is commonly provided in the ADC units 33. That is, in the column ADC 21, power that is consumed when the ADC units 33 perform the analog/digital conversion processing is supplied to the ADC units 33 from the power supply line PWR that is commonly provided. Therefore, in the column ADC 21, power supply noise generated when the analog/digital conversion processing is performed occurs and the power supply noise causes interference between the column ADCs.

In the data transfer unit 22, a logic circuit 34 including a plurality of logic circuits 34 corresponding to the columns from which data is to be read out transfers the digital value output from the ADC unit 33 to the orthogonal memory 23.

As described above, in the semiconductor device 1 according to the first embodiment, the circuit elements (e.g., pixel output circuits 31, signal path switch circuits 32, ADC units 33) included in the column selection circuit 19, the conversion signal selection circuit 20, and the column. ADC 21 are arranged in one line in the column direction of the pixel array 18 (e.g., direction in which lines for reading out the pixel information are aligned).

Figure 3:
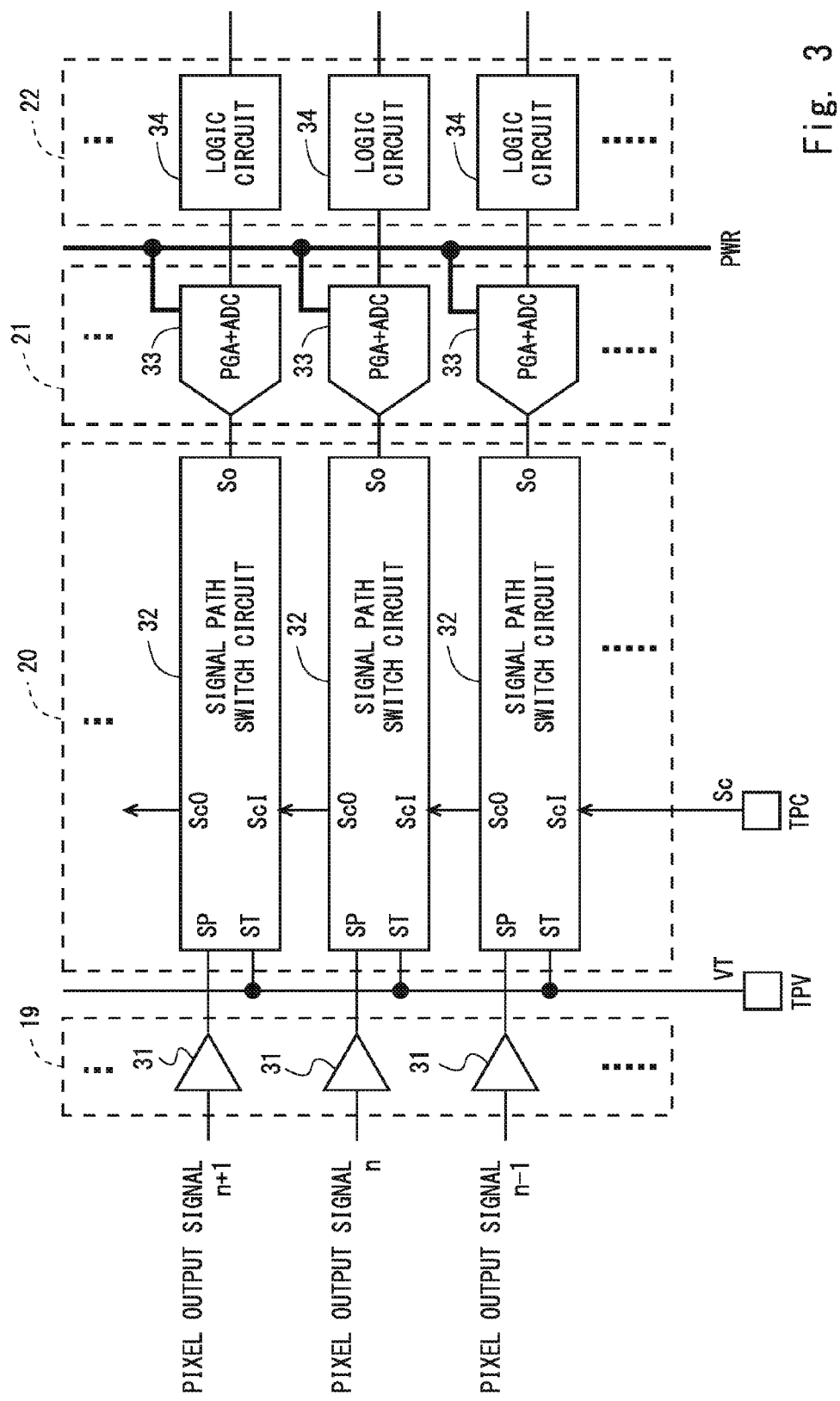
FIG. 3 is a block diagram showing another example of the conversion signal selection circuit and the column ADC according to the first embodiment.

FIG. 3 shows a block diagram of the conversion signal selection circuit and the column ADC when the test control circuit 26 is provided outside the semiconductor device as another example of the semiconductor device 1 according to the first embodiment. In this case, a first test terminal (e.g., test terminal TPV) and a second test terminal (e.g., test terminal TPS) are provided in place of the test control circuit 26. The test signal VT is supplied to the test terminal TPV from an external evaluation apparatus or the like. The control signal Sc is supplied to the test terminal TPS from an external evaluation apparatus or the like. Further, while not shown in FIG. 3, a terminal to input the clock signal to input the selection value may be provided in FIG. 3. The test terminals TPV and TPS may be pins of a package of the semiconductor device 1 or may be pads on a chip on which the semiconductor device 1 is formed.

Figure 4:
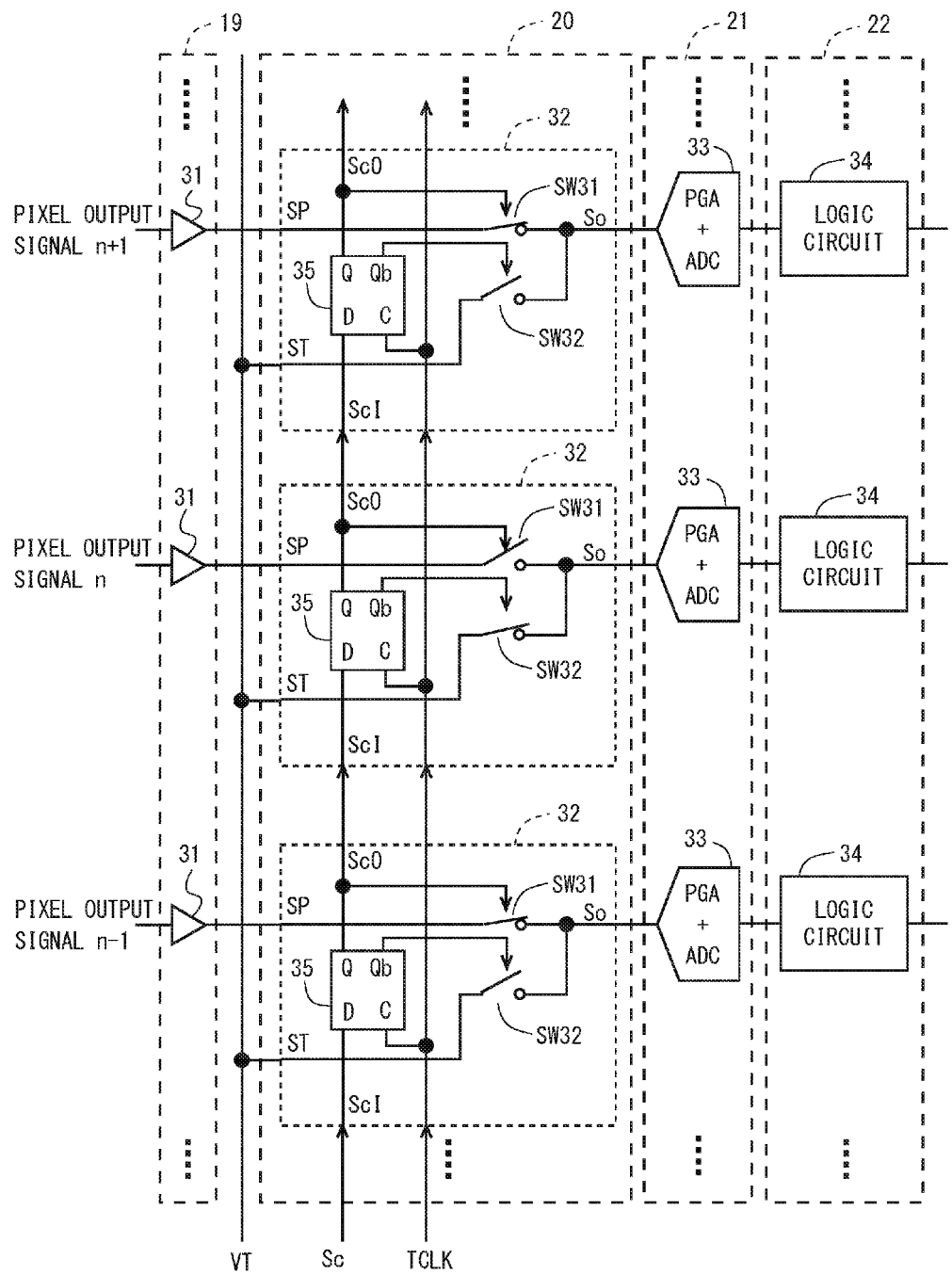
FIG. 4 is a block diagram for describing a specific circuit example of the conversion signal selection circuit according to the first embodiment.

In the semiconductor device 1 according to the first embodiment, by providing the conversion signal selection circuit 20, the interference between the column ADCs, or more specifically, the interference between the ADC units 33, can be evaluated. Further, in the evaluation that uses the conversion signal selection circuit 20, a large variety of patterns of the analog/digital conversion processing can be evaluated. The configuration of the conversion signal selection circuit 20 will be further described in detail. FIG. 4 shows a block diagram for describing a specific circuit example of the conversion signal selection circuit according to the first embodiment. In the description with reference to FIG. 4, the signal path switch circuits 32 will be described in detail and the description regarding the other blocks will be omitted.

As shown in FIG. 4, the signal path switch circuits 32 each include a first switch (e.g., switch SW31), a second switch (e.g., switch SW32), and a selection value holding unit 35. The switch SW31 has one end to which the pixel output signal output from the column selection circuit 19 is supplied and the other end to which the analog/digital conversion circuit (e.g., ADC unit 33) is connected. The switch SW32 has one end to which the test signal VT is supplied and the other end to which the ADC unit 33 is connected. The switch SW31 and the switch SW32 are conducted exclusively from each other in accordance with the selection value supplied as the test pattern. In the semiconductor device 1 according to the first embodiment, the selection value that controls the opened/closed state of the switches SW31 and SW32 is held in the selection value holding unit 35.

The selection value holding unit 35 is, for example, a D flip-flop. The selection value holding unit 35 has a data input terminal D to which the control signal Sc is supplied and a clock input terminal C to which the clock signal is supplied. This clock signal is output by, for example, the signal switch control circuit 28. The selection value that the selection value holding unit 35 has held according to the clock signal is output from a data output terminal Q of the selection value holding unit 35. Further, the inverted value of the selection value that the selection value holding unit 35 has held according to the clock signal is output from an inverted data output terminal Qb of the selection value holding unit 35.

Further, in the semiconductor device 1 according to the first embodiment, the data output terminal Q and the data input terminal D of the selection value holding units 35 included in the adjacent signal path switch circuits 32 are connected to each other. That is, in the semiconductor device 1 according to the first embodiment, the selection value holding units 35 included in the conversion signal selection circuit 20 are cascade-connected. One clock signal is supplied to the selection value holding unit 35 in the conversion signal selection circuit 20 and the selection value included in the control signal Sc output from the signal switch control circuit 28 in accordance with the clock signal is sequentially transferred to the subsequent selection value holding unit 35.

Next, an operation of the semiconductor device 1 according to the first embodiment will be described. First, the test patterns used in the semiconductor device 1 according to the first embodiment will be described. FIG. 5 shows a table for describing the test patterns in the semiconductor device 1 according to the first embodiment.

As shown in FIG. 5, in the semiconductor device 1 according to the first embodiment, two test patterns (e.g., a signal combination pattern and an input signal pattern) form one interference evaluation pattern. The signal combination pattern is a pattern in which selection values are arranged. One signal combination pattern has a length corresponding to the number of selection value holding units 35 that are connected in the line. FIG. 5 shows an example in which cascade-connected circuits of the selection value holding units 35 different from each other are used for odd-numbered columns (e.g., the columns of the pixels from which the pixel output values are read out by the column selection circuit 19a) and even-numbered columns (e.g., the column of the pixels from which the pixel output values are read out by the column selection circuit 19b). In this case, the same signal combination pattern is supplied to the conversion signal selection circuit 20a and the conversion signal selection circuit 20b. Further, it can be also said that the signal combination pattern indicates the combination of the ADC unit 33 to which the pixel output signal is supplied and the ADC unit 33 to which the test signal VT is supplied.

The input signal pattern specifies the combination of the voltage changes of the pixel output signal and the test signal VT. In this example, there are two types of voltage changes: a constant voltage in which the voltage is constant regardless of time and a sweep voltage in which the voltage monotonically increases or monotonically decrease for every predetermined time. For example, a signal pattern 1 shown in FIG. 5 gives the constant voltage as the pixel output signal and gives the sweep voltage as the test signal. A signal pattern 2 sets both the voltages of the pixel output signal and the test signal to the constant voltage. A signal pattern 3 gives the sweep voltage as the pixel output signal and gives the constant voltage as the test signal. The signal pattern 2 sets both the voltages of the pixel output signal and the test signal to the sweep voltage. The pixel output signal is supplied to the ADC unit 33 by the signal path switch circuit 32 to which 0 has been supplied as the selection value and the test signal is supplied to the ADC unit 33 by the signal path switch circuit 32 to which 1 has been supplied as the selection value. The test signal may have a waveform other than the waveform in which the voltage monotonically increases or monotonically decreases.

Figure 6:
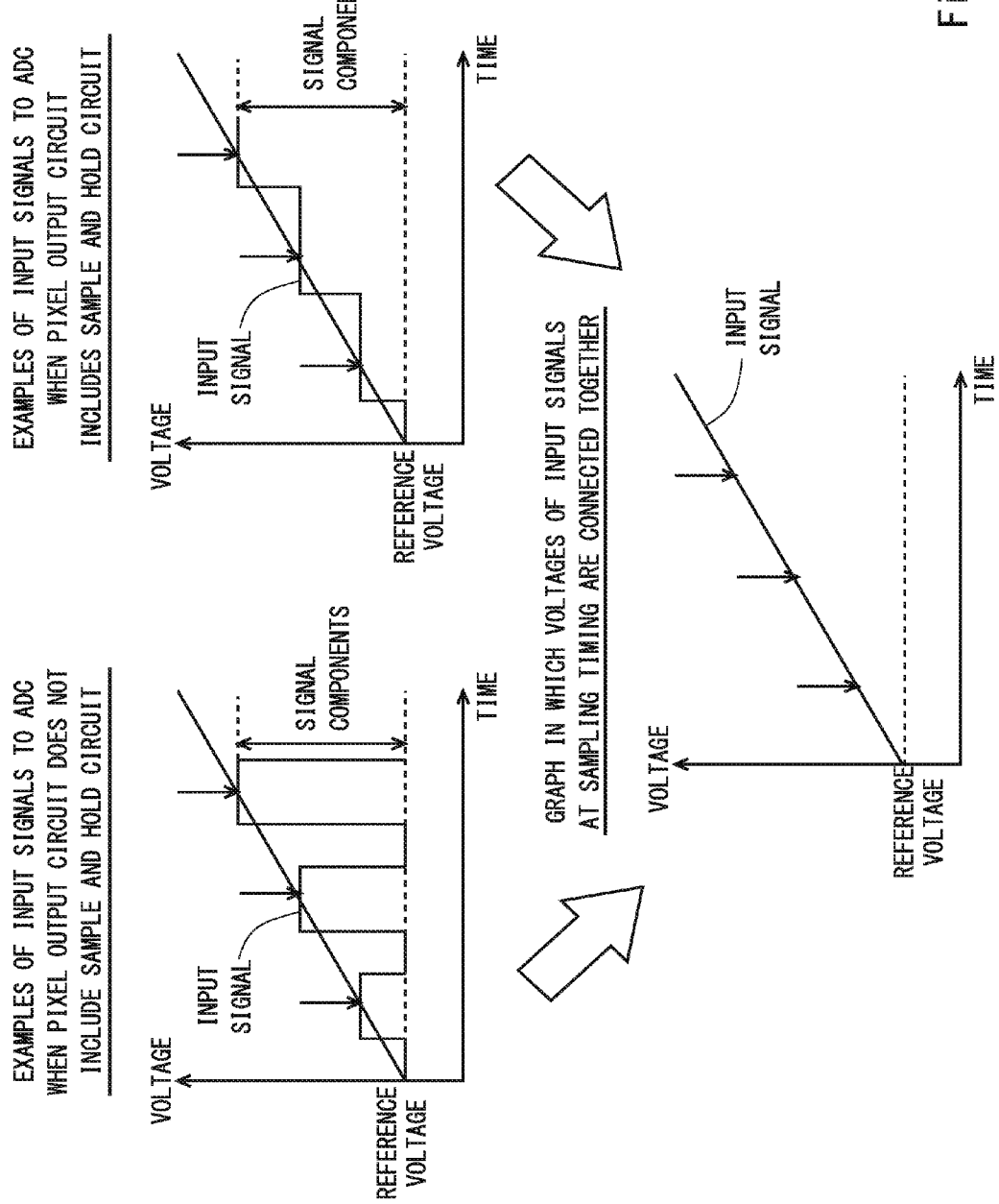
FIG. 6 is a graph for describing a sweep voltage among test signals in the semiconductor device according to the first embodiment.

The sweep voltage will be described in detail. FIG. 6 shows a graph for describing the sweep voltage among the test signal in the semiconductor device according to the first embodiment. While the sweep voltage in which the voltage monotonically changes is shown in FIG. 6, the idea of the voltage changes is the same also in the case in which the voltage monotonically decreases. In FIG. 6, the signal input to the ADC unit 33 is called an input signal including the pixel input signal and the test signal VT. Further, in FIG. 6, timings when the ADC unit 33 performs sampling are shown by arrows.

As shown in FIG. 6, the sweep voltage is a voltage in which the voltage of the input signal monotonically increases when the voltages of the input signals when the column ADC performs sampling are connected together. The actual waveform of the input signal varies depending on whether the pixel output circuit includes a sample and hold circuit. When the pixel output circuit does not include the sample and hold circuit, the actual waveform of the input signal becomes a pulse-like waveform. The difference between the voltage at the peak of the pulse and a reference voltage (e.g., operating point of the ADC unit 33) corresponds to the magnitude of the signal components of the input signal. Further, when the pixel output circuit includes a sample and hold circuit, the actual waveform of the input signal becomes a step-like waveform. The difference between the voltage of each step and the reference voltage corresponds to the magnitude of the signal components of the input signal.

Figure 7:
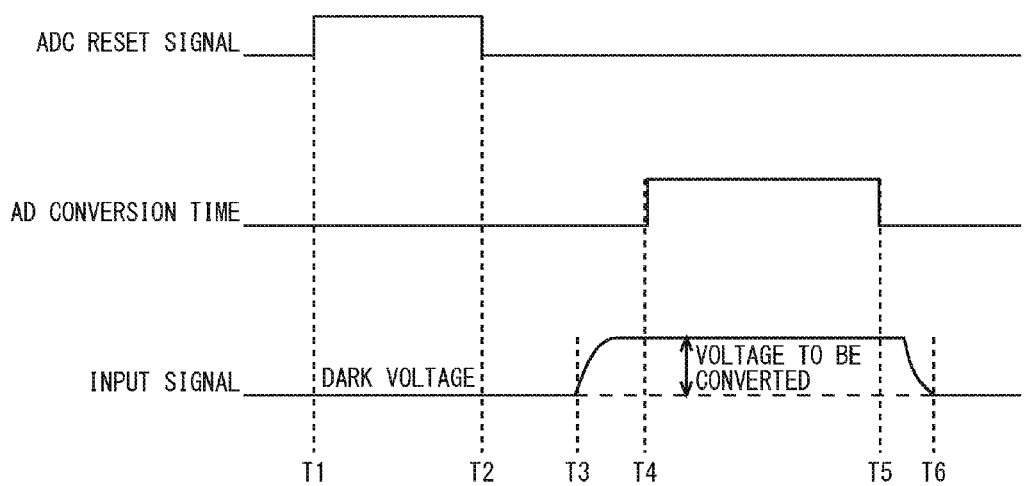
FIG. 7 is a timing chart for describing an operation of analog/digital conversion processing of the column ADC in the semiconductor device according to the first embodiment.

Next, an operation of the ADC unit 33 will be described. FIG. 7 shows a timing chart for describing the operation of the analog/digital conversion processing of the ADC unit 33 in the semiconductor device 1 according to the first embodiment. FIG. 7 shows the operation of the column ADC in one analog/digital conversion processing.

As shown in FIG. 7, the ADC unit 33 performs a reset operation from timing T1 to timing T2. During this operation, the voltage of the input signal to the ADC unit 33 is a dark voltage. Due to this reset operation, the ADC unit 33 resets the charge accumulated in the previous process cycle.

Next, in the semiconductor device 1, at timing T3, the input signal is input to the ADC unit 33. This increases the input voltage to the ADC unit 33. From timing T4 in which the input voltage has become stable, the ADC unit 33 starts the conversion processing and the conversion processing is completed at timing T5. The semiconductor device 1 makes the voltage level of the input signal back to the dark voltage after the timing T5.

Figure 8:
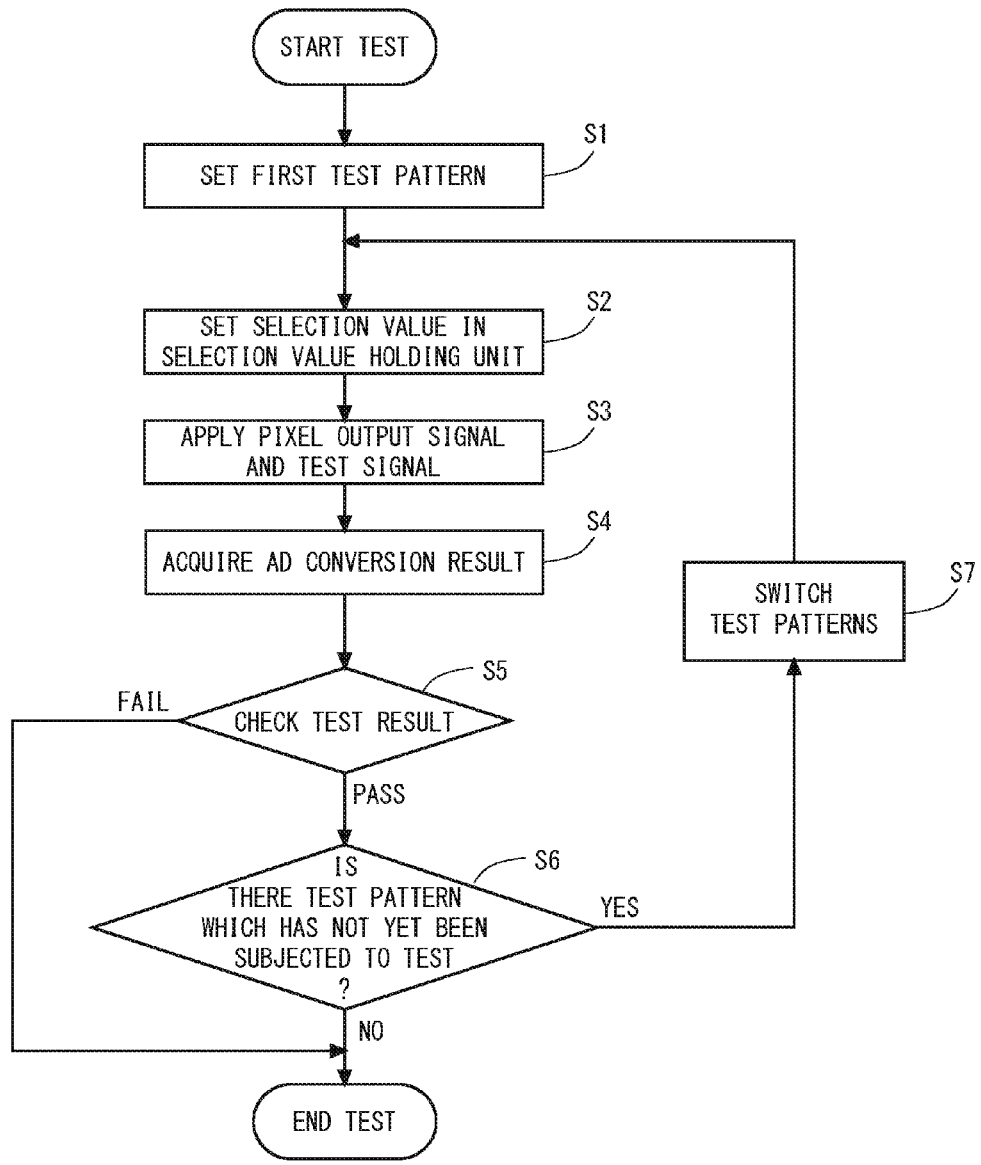
FIG. 8 is a flowchart for describing a procedure for evaluating an interference between column ADCs in the semiconductor device according to the first embodiment.

Next, the interference evaluation procedure between the column ADCs in the semiconductor device 1 according to the first embodiment will be described. FIG. 8 shows a flowchart for describing a procedure for the interference evaluation between the column ADCs in the semiconductor device 1 according to the first embodiment.

As shown in FIG. 8, in the semiconductor device 1 according to the first embodiment, the test control circuit 26 first sets the first test pattern (Step S1). The test pattern includes the signal combination pattern and the input signal pattern described with reference to FIG. 5. Then the test control circuit 26 gives the configuration value to the selection value holding unit 35 according to the test pattern that has been set (Step S2). Next, the test control circuit 26 gives the test signal VT to the ADC unit 33 (Step S3). At this time, the column selection circuit 19 reads out the pixel information from the pixel array 18 and gives the pixel output signal to the ADC unit 33 (Step S3). Accordingly, the test signal VT is supplied to the ADC unit 33 corresponding to the signal path switch circuit 32 to which 1 has been supplied as the selection value and the pixel output signal is supplied to the ADC unit 33 corresponding to the signal path switch circuit 32 to which 0 has been supplied as the selection value.

Then, the semiconductor device 1 according to the first embodiment acquires the result of the analog/digital conversion processing in the state of Step S3 (Step S4). Next, the result of the test that has been acquired is checked. (Step S5). The result of the test is checked by, for example, an external evaluation apparatus. When the result of the test indicates "pass", the test control circuit 26 checks if there is a test pattern which has not yet been subjected to the test (Step S6). When there is a test pattern which has not yet been subjected to the test, the test pattern is switched (Step S7) and the processing from Step S2 to Step S5 is executed again. When the result of the test indicates "failed", the test is ended.

From the aforementioned description, the semiconductor device 1 according to the first embodiment includes the conversion signal selection circuit 20, whereby it is possible to select which one of the test signal VT and the pixel output signal should be supplied for each of the ADC units 33. Further, the semiconductor device 1 according to the first embodiment is able to select the constant voltage or the sweep voltage as the test voltage VT that can be supplied to the ADC unit 33. Accordingly, in the semiconductor device 1 according to the first embodiment, a large variety of interference patterns can be checked.

The power consumption of the column ADC may vary due to a difference in the voltage level of the input signal. This is due to a change of transition timings of the operation state of the ADC and a change in the state itself because of the difference in the voltage level of the input signal. The power consumption is changed before and after the state is changed and in the transient period in which the state is changed. The change in the power consumption results in a change in the power supply noise. Power is supplied to the ADC unit 33 from a common power supply line. Therefore, the change in the power supply noise that occurs due to the change in the power consumption in a close area may affect the result of the conversion in the ADC unit 33 arranged in another area. However, when only the ground voltage can be selected as the test signal as disclosed in Japanese Unexamined Patent Application Publication No. 2011-239344, it is impossible to reproduce the difference in the power consumption based on the voltage difference or the voltage change in the input signal.

On the other hand, the semiconductor device 1 according to the first embodiment sets the test voltage VT to the constant voltage or the sweep voltage while setting the light incident on the pixel array 18 so that the voltage of the pixel output signal becomes the constant voltage or the sweep voltage, whereby it is possible to input the pattern of the complicated input signal to the ADC unit 33. Therefore, in the semiconductor device 1 according to the first embodiment, it is possible to reproduce the conversion error that can be reproduced only by a combination of complicated input signals.

Further, in the semiconductor device 1 according to the first embodiment, the signal path switch circuit 32 is able to select the signal to be input for each ADC unit 33, whereby it is possible to obtain a large variety of combinations of the input signals without using an optical slit.

Further, in the semiconductor device 1 according to the first embodiment, the combination of selection values to be supplied to the signal path switch circuit 32 is set by the selection value holding units 35 that are cascade-connected. Accordingly, in the semiconductor device 1 according to the first embodiment, it is possible to simplify the signal line to supply the selection value to the plurality of signal path switch circuits 32 and to reduce the chip area. In recent years, the number of pixels of the pixel array 18 has been increased and the number of signal path switching circuits 32 in the conversion signal selection circuit 20 are several hundreds to several thousands. The problem that it is impossible to realistically form the line to set the selection value can be solved by the semiconductor device 1 according to the first embodiment.

Second Embodiment

Figure 9:
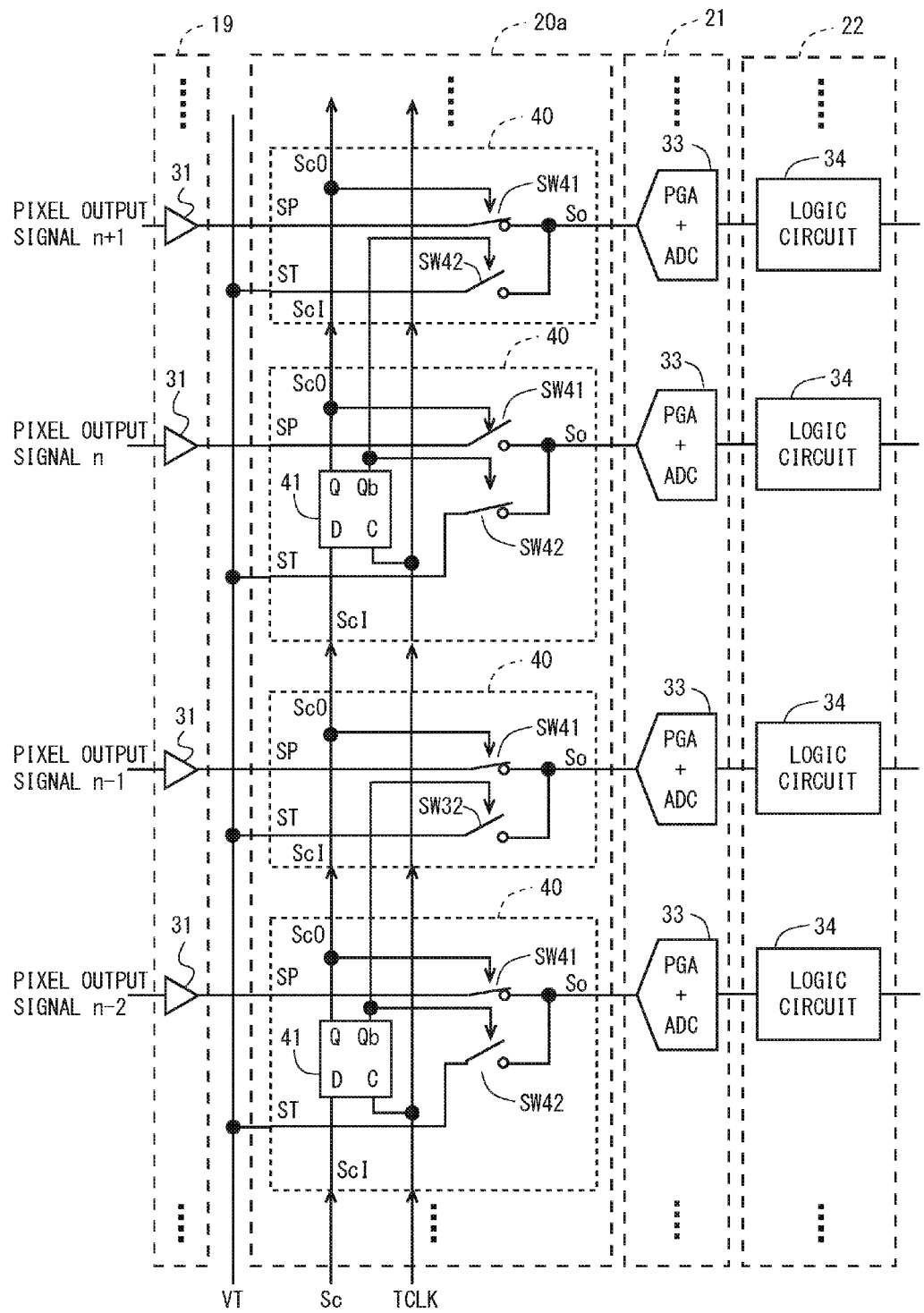
FIG. 9 is a block diagram for describing a specific circuit example of a conversion signal selection circuit according to a second embodiment.

In a second embodiment, a conversion signal selection circuit 20a, which is another form of the conversion signal selection circuit 20 according to the first embodiment, will be described. FIG. 9 shows a block diagram for describing a specific circuit example of the conversion signal selection circuit 20a according to the second embodiment. In the description of the second embodiment, components the same as those in the first embodiment are denoted by reference symbols the same as those in the first embodiment and the descriptions thereof will be omitted.

As shown in FIG. 9, the conversion signal selection circuit 20a includes, in place of the plurality of signal path switch circuits 32, a plurality of signal switch control circuits 40. The plurality of signal switch control circuits 40 each include a first switch (e.g., switch SW41) and a second switch (e.g., switch SW42). The first switch and the second switch have the configurations the same as those of the first switch and the second switch according to the first embodiment.

On the other hand, in the conversion signal selection circuit 20a, selection value holding units 41 are provided in only some of the plurality of signal switch control circuits 40. In the example shown in FIG. 9, the selection value holding units 41 are provided in the odd-numbered signal switch control circuits 40 and the selection value holding units 41 are not provided in the even-numbered signal switch control circuits 40. In the conversion signal selection circuit 20a according to the second embodiment, the signal switch control circuit 40 in which the selection value holding unit 41 is not provided obtains the selection value that controls the opened/closed state of the switches SW41 and SW42 from the signal switch control circuit 40 that includes the selection value holding unit 41. That is, in the semiconductor device according to the second embodiment, one selection value holding unit 41 is provided for the signal switch control circuits 40 for i (i is an integer indicating the number of signal switch control circuits 40) columns.

From the aforementioned description, in the semiconductor device according to the second embodiment, the number of selection value holding units 41 is smaller than that in the semiconductor device 1 according to the first embodiment. Therefore, it is possible to reduce the chip size. On the other hand, since the reproducibility of the interference between the ADC units 33 can be ensured even in a case in which the operation differs for each of two or more ADC units 33, the reproducibility of the interference does not decrease unless an extremely large number of selection value holding units 41 are decreased.

Third Embodiment

Figure 10:
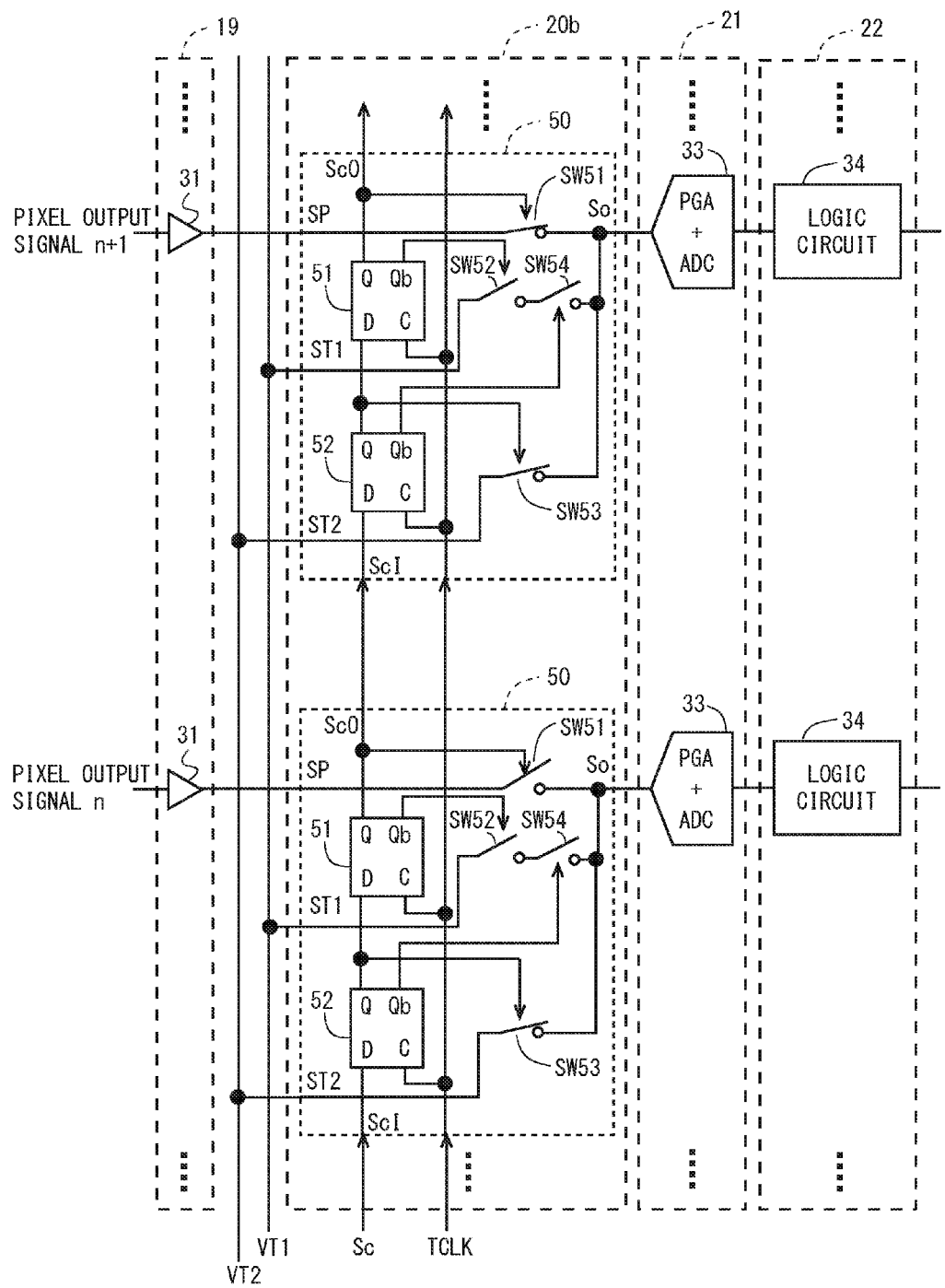
FIG. 10 is a block diagram for describing a specific circuit example of a conversion signal selection circuit according to a third embodiment.

In a third embodiment, a conversion signal selection circuit 20b, which is another form of the conversion signal selection circuit 20 according to the first embodiment, will be described. FIG. 10 shows a block diagram for describing a specific circuit example of the conversion signal selection circuit 20b according to the third embodiment. In the description of the third embodiment, components the same as those in the first embodiment are denoted by reference symbols the same as those in the first embodiment and the descriptions thereof will be omitted.

As shown in FIG. 10, the conversion signal selection circuit 20b includes a plurality of signal switch control circuits 50 in place of the plurality of signal path switch circuits 32. The plurality of signal switch control circuits 50 each include a first switch (e.g., switch SW51), a second switch (e.g., switch SW52), a third switch (e.g., switch SW53), and a fourth switch (switch SW54). Further, in the semiconductor device according to the third embodiment, a first test signal VT1 and a second test signal VT2 are used as the test signal. The first test signal VT1 and the second test signal VT2 are output, for example, by the test voltage generation circuit 27 and voltage values independent from each other are set as the first test signal VT1 and the second test signal VT2.

The switch SW51 is provided between the pixel output circuit 31 and the ADC unit 33. The switch SW52 has one end to which the first test signal VT1 is input. The switch SW51 and the switch SW52 are controlled exclusively with each other. The switch SW53 has one end to which the second test signal VT2 is input and the other end to which the ADC unit 33 is connected. The switch SW54 is connected between the switch SW52 and the ADC unit 33 and is controlled to a state in which the switch SW 54 and the switch SW 53 are conducted exclusively from each other.

Further, in the conversion signal selection circuit 20b, the plurality of signal switch control circuits 50 each include a first selection value holding unit (e.g., selection value holding unit 51) and a second selection value holding unit (e.g., selection value holding unit 52). The selection value holding unit 51 holds a first selection value that controls the switch SW51 and the switch SW52. The selection value holding unit 52 holds the second selection value that controls the third switch and the fourth switch.

In the conversion signal selection circuit 20b according to the third embodiment, in the signal switch control circuit 50, the selection value output from the selection value holding unit 52 is input to the data input terminal of the selection value holding unit 51. Further, between adjacent signal switch control circuits, the selection value output from the selection value holding unit 51 of the previous signal switch control circuit 50 is input to the data input terminal of the selection value holding unit 52 of the subsequent signal switch control circuit 50. That is, in the conversion signal selection circuit 20b, the selection value holding units 51 and 52 are cascade-connected so that they are alternatively connected across the plurality of signal switch control circuits 50. That is, in the semiconductor device according to the third embodiment, the selection value holding units 41 corresponding to j bits (e.g., two bits) are provided in one signal switch control circuit 50.

From the aforementioned description, the semiconductor device according to the third embodiment uses two test signals and includes the selection value holding units corresponding to two bits in one selection value holding unit 50, whereby it is possible to increase the number of test signals that can be selected as the input signal to the ADC unit 33. Accordingly, in the semiconductor device according to the third embodiment, it is possible to verify a more complicated interference pattern compared to that in the semiconductor device 1 according to the first embodiment.

Fourth Embodiment

Figure 11:
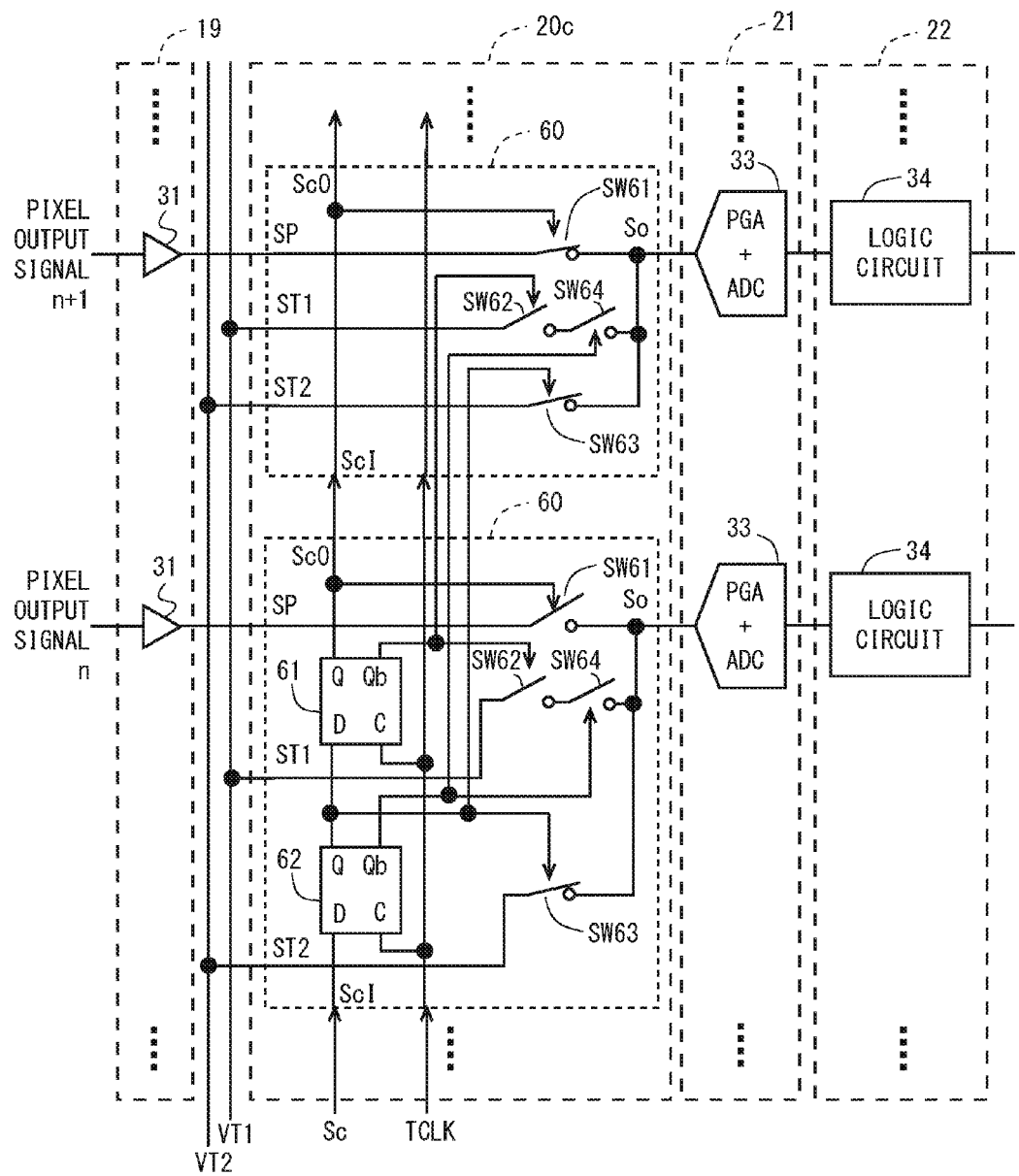
FIG. 11 is a block diagram for describing a specific circuit example of a conversion signal selection circuit according to a fourth embodiment.

In a fourth embodiment, a conversion signal selection circuit 20c, which is another form of the conversion signal selection circuit 20 according to the first embodiment, will be described. FIG. 11 shows a block diagram for describing a specific circuit example of the conversion signal selection circuit 20c according to the fourth embodiment. In the description of the fourth embodiment, components the same as those in the first embodiment are denoted by reference symbols the same as those in the first embodiment and the descriptions thereof will be omitted.

As shown in FIG. 11, the conversion signal selection circuit 20c includes a plurality of signal switch control circuits 60 in place of the plurality of signal path switch circuits 32. The plurality of signal switch control circuits 60 each include a first switch (e.g., switch SW61) to a fourth switch (e.g., switch SW64). The first to fourth switches have the configurations the same as those of the first to fourth switches according to the third embodiment.

On the other hand, in the conversion signal selection circuit 20c, selection value holding units 61 and 62 are provided in only some of the plurality of signal switch control circuits 60. The selection value holding units 61 and 62 are the same as the selection value holding units 51 and 52 described in the third embodiment. In the example shown in FIG. 11, the selection value holding units 61 are provided in the odd-numbered signal switch control circuits 60 and the selection value holding units 61 and 62 are not provided in the even-numbered signal switch control circuits 60. In the conversion signal selection circuit 20c according to the fourth embodiment, the signal switch control circuit 60 in which the selection value holding units 61 and 62 are not provided obtains the selection value that controls the opened/closed state of the switches SW61 to SW64 from the signal switch control circuit 60 that includes the selection value holding unit 61. That is, the semiconductor device according to the fourth embodiment uses the selection value holding units corresponding to j bits for the signal switch control circuits 60 corresponding to i (i is an integer indicating the number of signal switch control circuits 40) columns.

From the aforementioned description, in the semiconductor device according to the fourth embodiment, similar to the semiconductor device according to the third embodiment, it is possible to achieve an interference evaluation by a complicated pattern and to reduce the chip area. On the other hand, since the reproducibility of the interference between the ADC units 33 can be ensured even in a case in which the operation differs for each of two or more ADC units 33, the reproducibility of the interference does not decrease unless an extremely large number of selection value holding units 41 are decreased.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first and fourth embodiments can be combined as desirable by one of ordinary skill in the art.

What is claimed is:

1. A semiconductor device comprising:
a pixel array in which pixels are arranged in a form of a matrix, the pixel array configured to output pixel information based on incident light information;
a plurality of pixel output circuits, each configured to output the pixel information output for each row from the pixels arranged in the pixel array as a pixel output signal;
a plurality of analog/digital conversion circuits that are provided so as to correspond to the plurality of pixel output circuits, each of the plurality of analog/digital conversion circuits configured to convert the pixel output signal output from the pixel output circuit into a digital value, and arranged in a column direction of the pixel array;
a test signal generation circuit configured to generate a test signal having a test voltage; and
a conversion signal selection circuit that is provided between the pixel output circuit and the analog/digital conversion circuit, and configured to select one of the pixel output signal and the test signal for each of the analog/digital conversion circuits according to a test pattern, and outputs the selected signal,
wherein the test voltage has one of an increasing pulse-like waveform comprising a plurality of pulses, decreasing pulse-like waveform comprising a plurality of pulses, increasing step-like waveform comprising a plurality of steps and decreasing step-like waveform comprising a plurality of steps, during a sampling period of the plurality of analog/digital conversion circuits.

2. The semiconductor device according to claim 1, wherein the test signal generation circuit further configured to change the test voltage at predetermined time intervals.

3. The semiconductor device according to claim 2, wherein the test signal generation circuit is further configured to monotonically increase or monotonically decrease the test voltage at the predetermined time intervals.

4. The semiconductor device according to claim 1, wherein power is supplied to the plurality of analog/digital conversion circuits by a common power supply line.

5. The semiconductor device according to claim 1, wherein:
the conversion signal selection circuit comprises a plurality of signal path switch circuits that are aligned in one direction so that they correspond to the plurality of analog/digital conversion circuits,
the plurality of signal path switch circuits each comprise:
a first switch having one end to which the pixel output signal is supplied and another end to which the analog/digital conversion circuit is connected; and
a second switch having one end to which the test signal is supplied and another end to which the analog/digital conversion circuit is connected, and
the first switch and the second switch are conducted exclusively from each other according to a selection value that is supplied as the test pattern.

6. A semiconductor device comprising:
a pixel array in which pixels are arranged in a form of a matrix, the pixel array configured to output pixel information based on incident light information;

a plurality of pixel output circuits, each configured to output the pixel information output for each row from the pixels arranged in the pixel array as a pixel output signal;

a plurality of analog/digital conversion circuits that are provided so as to correspond to the plurality of pixel output circuits, each of the plurality of analog/digital conversion circuits configured to convert the pixel output signal output from the pixel output circuit into a digital value, and arranged in a column direction of the pixel array;

a test signal generation circuit configured to generate a test signal having a test voltage; and a conversion signal selection circuit that is provided between the pixel output circuit and the analog/digital conversion circuit, and configured to select one of the pixel output signal and the test signal for each of the analog/digital conversion circuits according to a test pattern, and outputs the selected signal, wherein power is supplied to the plurality of analog/digital conversion circuits by a common power supply line, wherein:

the conversion signal selection circuit comprises a plurality of signal path switch circuits that are aligned in one direction so that they correspond to the plurality of analog/digital conversion circuits, the plurality of signal path switch circuits each comprise:

a first switch having one end to which the pixel output signal is supplied and another end to which the analog/digital conversion circuit is connected; and a second switch having one end to which the test signal is supplied and another end to which the analog/digital conversion circuit is connected, and the first switch and the second switch are conducted exclusively from each other according to a selection value that is supplied as the test pattern, wherein at least some of the plurality of signal path switch circuits include a selection value holding unit that holds the selection value of the test pattern, a plurality of selection value holding circuits that are cascade-connected and configured to sequentially transfer the selection value that is supplied from outside in accordance with a clock signal to a subsequent selection value holding circuit, and a state in which the first switch and the second switch are conducted and a state in which they are interrupted are controlled in accordance with the selection value held by the corresponding selection value holding circuit.

7. The semiconductor device according to claim 5, wherein:

the test signal generation circuit is further configured to output a first test signal and a second test signal as the test signals, voltage values of the first test signal and the second test signal being set independently from each other, the second switch has one end to which the first test signal is input, and the plurality of signal path switch circuits further comprise:

a third switch having one end to which the second test signal is supplied and the other end to which the analog/digital conversion circuit is connected; and a fourth switch that is connected between the second switch and the analog/digital conversion circuit and is controlled to be conducted with the third switch exclusively from each other.

8. The semiconductor device according to claim 7, wherein at least some of the plurality of signal path switch circuits comprise:

a first selection value holding circuit that holds a first selection value, the first selection value controlling the first switch and the second switch; and a second selection value holding circuit that holds a second selection value, the second selection value controlling the third switch and the fourth switch.

9. A semiconductor device comprising:

a pixel array in which pixels are arranged in a form of a matrix, the pixel array configured to output pixel information based on incident light information;

a plurality of pixel output circuits, each configured to output the pixel information output for each row from the pixels arranged in the pixel array as a pixel output signal;

a plurality of analog/digital conversion circuits that are provided so as to correspond to the plurality of pixel output circuits, each of the plurality of analog/digital conversion circuits configured to convert the pixel output signal output from the pixel output circuit into a digital value, and arranged in a column direction of the pixel array;

a first test terminal to which a test signal having a test voltage is input;

a conversion signal selection circuit that is provided between the pixel output circuit and the analog/digital conversion circuit, and configured to select one of the pixel output signal and the test signal for each of the analog/digital conversion circuits according to a selection value, and outputs the selected signal; and a second test terminal to which a control signal including the selection value is input, wherein the test voltage has one of an increasing pulse-like waveform comprising a plurality of pulses, decreasing pulse-like waveform comprising a plurality of pulses, increasing step-like waveform comprising a plurality of steps and decreasing step-like waveform comprising a plurality of steps, during a sampling period of the plurality of analog/digital conversion circuits.

10. The semiconductor device according to claim 1, wherein the conversion signal selection circuit further comprises a selection value holding circuit configured to hold a selection value of the test pattern.

11. The semiconductor device according to claim 1, further comprising:

a plurality of selection value holding circuits that are cascade-connected and configured to sequentially transfer the selection value that is supplied from outside in accordance with a clock signal to a subsequent selection value holding circuit.

* * * * *